US 12,489,081 B2

(12) United States Patent
Kim et al.

(10) Patent No.: US 12,489,081 B2
(45) Date of Patent: Dec. 2, 2025

(54) SEMICONDUCTOR PACKAGE INCLUDING UNDERFILL AND METHOD OF FORMING THE SAME

(71) Applicant: Samsung Electronics Co., Ltd., Suwon-si (KR)

(72) Inventors: Jinyoung Kim, Suwon-si (KR); Jiyeong Kim, Anyang-si (KR); Okseon Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 405 days.

(21) Appl. No.: 18/049,428

(22) Filed: Oct. 25, 2022

(65) Prior Publication Data

US 2023/0154885 A1 May 18, 2023

(30) Foreign Application Priority Data

Nov. 17, 2021 (KR) ........................ 10-2021-0158385

(51) Int. Cl.
*H01L 23/00* (2006.01)
*H01L 21/56* (2006.01)
(Continued)

(52) U.S. Cl.
CPC ............ *H01L 24/73* (2013.01); *H01L 21/563* (2013.01); *H01L 23/295* (2013.01); *H01L 24/16* (2013.01); *H01L 24/29* (2013.01); *H01L 24/32* (2013.01); *H01L 25/18* (2013.01); *H01L 25/50* (2013.01); *H01L 24/05* (2013.01); *H01L 24/13* (2013.01); *H01L 2224/05609* (2013.01); *H01L 2224/05611* (2013.01); *H01L 2224/05613* (2013.01); *H01L 2224/05616* (2013.01); *H01L 2224/05617* (2013.01); *H01L 2224/05618* (2013.01); *H01L 2224/05624* (2013.01); *H01L 2224/05638* (2013.01); *H01L 2224/05639* (2013.01); *H01L 2224/05644* (2013.01);
(Continued)

(58) Field of Classification Search
CPC ...... H01L 21/563; H01L 23/295; H01L 24/73
See application file for complete search history.

(56) References Cited

U.S. PATENT DOCUMENTS 10,403,603 B2 9/2019 Park et al.
10,490,525 B1 11/2019 Chen et al.
(Continued)

FOREIGN PATENT DOCUMENTS

KR 20140094086 A 7/2014
KR 10-2017-0098586 A 8/2017
(Continued)

*Primary Examiner* — Errol V Fernandes
(74) *Attorney, Agent, or Firm* — Wolf, Greenfield & Sacks, P.C.

(57) ABSTRACT

A semiconductor package includes a first semiconductor chip on a lower structure. A first underfill is between the first semiconductor chip and the lower structure. The first underfill includes a first portion adjacent to a center region of the first semiconductor chip, and a second portion adjacent to an edge region of the first semiconductor chip. The second portion has a higher degree of cure than the first portion. A plurality of inner connection terminals is between the first semiconductor chip and the lower structure. The plurality of inner connection terminals extends in the first underfill.

18 Claims, 12 Drawing Sheets

(51) Int. Cl.
*H01L 23/29* (2006.01)
*H01L 25/00* (2006.01)
*H01L 25/18* (2023.01)

(52) U.S. Cl.
CPC ............... *H01L 2224/05647* (2013.01); *H01L 2224/05649* (2013.01); *H01L 2224/05655* (2013.01); *H01L 2224/05657* (2013.01); *H01L 2224/05663* (2013.01); *H01L 2224/05664* (2013.01); *H01L 2224/05666* (2013.01); *H01L 2224/05669* (2013.01); *H01L 2224/0567* (2013.01); *H01L 2224/05673* (2013.01); *H01L 2224/05676* (2013.01); *H01L 2224/0568* (2013.01); *H01L 2224/05681* (2013.01); *H01L 2224/05683* (2013.01); *H01L 2224/05684* (2013.01); *H01L 2224/05686* (2013.01); *H01L 2224/13109* (2013.01); *H01L 2224/13111* (2013.01); *H01L 2224/13113* (2013.01); *H01L 2224/13116* (2013.01); *H01L 2224/13117* (2013.01); *H01L 2224/13118* (2013.01); *H01L 2224/13124* (2013.01); *H01L 2224/13138* (2013.01); *H01L 2224/13139* (2013.01); *H01L 2224/13144* (2013.01); *H01L 2224/13149* (2013.01); *H01L 2224/13155* (2013.01); *H01L 2224/13157* (2013.01); *H01L 2224/13163* (2013.01); *H01L 2224/13164* (2013.01); *H01L 2224/13166* (2013.01); *H01L 2224/13169* (2013.01); *H01L 2224/1317* (2013.01); *H01L 2224/13173* (2013.01); *H01L 2224/13176* (2013.01); *H01L 2224/1318* (2013.01); *H01L 2224/13181* (2013.01); *H01L 2224/13183* (2013.01); *H01L 2224/13184* (2013.01); *H01L 2224/13186* (2013.01); *H01L 2224/16146* (2013.01); *H01L 2224/2929* (2013.01); *H01L 2224/29386* (2013.01); *H01L 2224/32145* (2013.01); *H01L 2224/73204* (2013.01)

(56) References Cited

U.S. PATENT DOCUMENTS

| | | |
|---|---|---|
| 10,886,248 B2 | 1/2021 | Lim et al. |
| 11,018,115 B2 | 5/2021 | Hwang et al. |
| 2015/0255312 A1* | 9/2015 | Brofman .......... H01L 23/49838 257/737 |
| 2020/0266078 A1 | 8/2020 | Eom et al. |

FOREIGN PATENT DOCUMENTS

| | | |
|---|---|---|
| KR | 102004825 B1 | 7/2019 |
| KR | 10-2021-0088305 A | 7/2021 |

* cited by examiner

SEMICONDUCTOR PACKAGE INCLUDING UNDERFILL AND METHOD OF FORMING THE SAME

CROSS-REFERENCE TO THE RELATED APPLICATION

This non-provisional patent application claims priority under 35 U.S.C § 119 from Korean Patent Application No. 10-2021-0158385, filed on Nov. 17, 2021, in the Korean Intellectual Property Office, the disclosure of which is incorporated herein by reference in its entirety.

BACKGROUND

1. Field

The example embodiments of the disclosure relate to a semiconductor package including an underfill and a method of forming the same.

2. Description of the Related Art

In accordance with demand for high integration of a semiconductor package, technology for mounting a plurality of semiconductor chips in one package is being developed. An underfill may be applied between the plurality of semiconductor chips. The underfill may protrude outside the plurality of semiconductor chips. Excessive lateral extension of the underfill may cause various problems.

SUMMARY

The example embodiments of the disclosure provide a semiconductor package capable of controlling excessive lateral extension of an underfill and a formation method thereof.

A semiconductor package according to example embodiments of the disclosure includes a first semiconductor chip on a lower structure. A first underfill is between the first semiconductor chip and the lower structure. The first underfill includes a first portion adjacent to a center region of the first semiconductor chip, and a second portion adjacent to an edge region of the first semiconductor chip. The second portion has a higher degree of cure than the first portion. A plurality of inner connection terminals are between the first semiconductor chip and the lower structure and extend into the first underfill.

A method for forming the semiconductor package in accordance with example embodiments of the disclosure includes forming, on the first semiconductor chip, a plurality of inner connection terminals and a preliminary underfill covering the plurality of inner connection terminals. The first semiconductor chip is stacked on the lower structure. The preliminary underfill is bonded between the first semiconductor chip and the lower structure. The preliminary underfill is cured using a laser bonding process, thereby forming a first underfill. The plurality of inner connection terminals reflows during the formation of the first underfill through the curing of the preliminary underfill.

A semiconductor package according to example embodiments of the disclosure a plurality of semiconductor chips sequentially stacked on a lower structure. A plurality of underfills is between the plurality of semiconductor chips and the lower structure. Each of the plurality of underfills includes a first portion adjacent to a center region of a semiconductor chip of the plurality of semiconductor chips, and a second portion adjacent to an edge region of the semiconductor chip. The second portion has a higher degree of cure than the first portion. A plurality of inner connection terminals are between the plurality of semiconductor chips and the lower structure and extend into the plurality of underfills.

DETAILED DESCRIPTION OF EXAMPLE EMBODIMENTS

Figure 1:
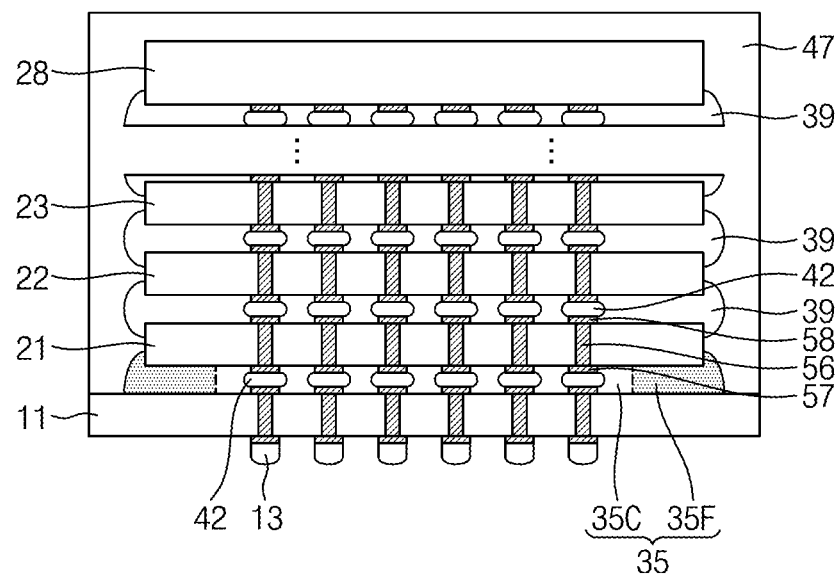
FIG. 1 is a sectional view explaining semiconductor packages according to example embodiments of the disclosure.
Figure 2:
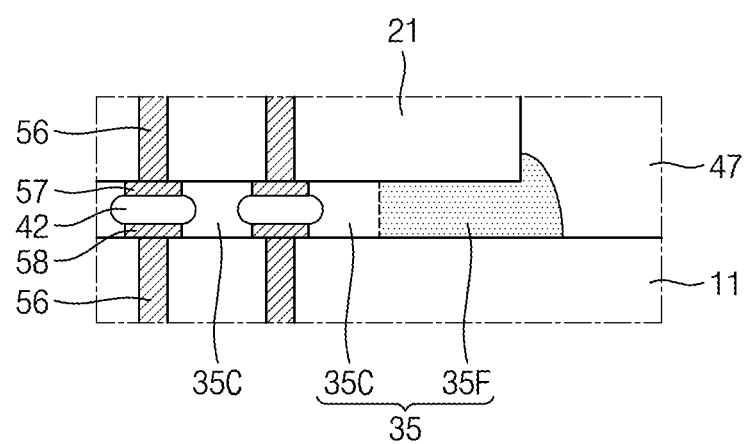
FIG. 2 is a partial view showing a portion of FIG. 1.

FIG. 1 is a sectional view explaining semiconductor packages according to example embodiments of the disclosure. FIG. 2 is a partial view showing a portion of FIG. 1.

Referring to FIGS. 1 and 2, the semiconductor packages according to the example embodiments of the disclosure may include a lower structure 11, a plurality of outer connection terminals 13, a first semiconductor chip 21, a second semiconductor chip 22, a third semiconductor chip 23, an upper semiconductor chip 28, a first underfill 35, a plurality of second underfills 39, a plurality of inner connection terminals 42, and an encapsulator 47.

Each of the first semiconductor chip 21, the second semiconductor chip 22, and the third semiconductor chip 23 may include a plurality of through-silicon vias 56, a plurality of first pads 57, and a plurality of second pads 58. The upper semiconductor chip 28 may include the plurality of first pads 57. The lower structure 11 may include the plurality of through-silicon vias 56, the plurality of first pads 57, and the plurality of second pads 58. The first underfill 35 may include a first portion 35C and a second portion 35F.

The lower structure 11 may include a buffer chip, a logic chip, a memory chip, an interposer, a printed circuit board, a ceramic substrate, or a combination thereof. In an embodiment, the lower structure 11 may include an inner wiring such as the plurality of through-silicon vias 56. The plurality of first pads 57 may be adjacent to a lower surface of the lower structure 11. The plurality of second pads 58 may be adjacent to an upper surface of the lower structure 11. The plurality of first pads 57 and the plurality of second pads 58 may be connected to the plurality of through-silicon vias 56.

The plurality of outer connection terminals 13 may be on the lower surface of the lower structure 11. The plurality of outer connection terminals 13 may contact the plurality of first pads 57. Each of the plurality of outer connection terminals 13 may include Sn, Ag, Cu, Al, AlN, Au, Be, Bi, Co, Hf, In, Mn, Mo, Ni, Pb, Pd, Pt, Rh, Re, Ru, Ta, TaN, Te, Ti, TiN, W, WN, Zn, Zr, or a combination thereof. Each of the plurality of outer connection terminals 13 may include a conductive bump, a conductive ball, a conductive pin, a conductive lead, a conductive pillar, or a combination thereof. For example, each of the plurality of outer connection terminals 13 may include an under bump metal (UBM) and a conductive bump. The plurality of outer connection terminals 13 may be omitted.

The first semiconductor chip 21 may be on the lower structure 11. The first underfill 35 may be bonded between the lower structure 11 and the first semiconductor chip 21. The plurality of inner connection terminals 42, which extends through the first under fill 35, may be between the lower structure 11 and the first semiconductor chip 21.

The first semiconductor chip 21 may include a volatile memory, a non-volatile memory, a microprocessor, a buffer chip, an application processor, a logic chip, or a combination thereof. In an embodiment, the first semiconductor chip 21 may include a dynamic random access memory (DRAM), a static random access memory (SRAM), a flash memory, an electrically erasable programmable read-only memory (EEPROM), a phase-change random access memory (PRAM), a magnetoresistive random access memory (MRAM), a resistive random access memory (RRAM), or a combination thereof. For example, the first semiconductor chip 21 may include a volatile memory such as DRAM.

The plurality of through-silicon vias 56 may extend in the first semiconductor chip 21. The plurality of through-silicon vias 56 may extend through the first semiconductor chip 21. The plurality of first pads 57 may be on a lower surface of the first semiconductor chip 21. The plurality of first pads 57 may contact the plurality of through-silicon vias 56. The plurality of second pads 58 may be on an upper surface of the first semiconductor chip 21. The plurality of second pads 58 may contact the plurality of through-silicon vias 56. The first semiconductor chip 21 may include a plurality of active/passive devices (not shown). The plurality of first pads 57 may be connected to a plurality of active/passive devices (not shown) in the first semiconductor chip 21. Each of the plurality of through-silicon vias 56, the plurality of first pads 57, and the plurality of second pads 58 may include Cu, Al, Ag, AlN, Au, Be, Bi, Co, Hf, In, Mn, Mo, Ni, Pb, Pd, Pt, Rh, Re, Ru, Sn, Ta, TaN, Te, Ti, TiN, W, WN, Zn, Zr, or a combination thereof.

The first underfill 35 may include a non-conductive film (NCF) including laser-sensitive additives. In an embodiment, the content of the laser-sensitive additives in the first underfill 35 may be 0.01 to 10 wt %. The laser-sensitive additives may include polybenzoxazole (PBO), polyimide (PI) such as photo-sensitive polyimide (PSPI), benzocyclobutene (BCB), or a combination thereof.

In an embodiment, the first underfill 35 may include a filler, a first epoxy, a second epoxy, a first polymer, a second polymer, a flux, and the laser-sensitive additives. The filler may include SiO, TiO, AlO, SiC, BN, or a combination thereof. For example, the filler may include $SiO_2$. The first epoxy may include a liquid type material to adjust bonding characteristics. The first epoxy may include bisphenol A, phenol novolac, bisphenol F, or a combination thereof. The second epoxy may include a solid type material to adjust bonding characteristics. The second epoxy may include naphthalene-group epoxy, cresol novolac epoxy, bisphenol A, or a combination thereof. The first polymer may include a hardener. The first polymer may include a novolac phenol resin, polyamine, polyamide, or a combination thereof. The second polymer may include a thermoplastic resin for film formation. The second polymer may include a phenoxy resin, a polyvinyl butyral (PVB) resin, or a combination thereof.

The second portion 35F of the first underfill 35 may have a higher degree of cure than the first portion 35C. In an embodiment, the first portion 35C of the first underfill 35 may have a degree of cure of 10 to 35%. The second portion 35F of the first underfill 35 may have a degree of cure of 50 to 80%. The degree of cure of the first underfill 35 may be determined and verified using a measurement device such as a Fourier-transform infrared spectroscope (FT-IR). The second portion 35F of the first underfill 35 may have a lower flowability than the first portion 35C.

The second portion 35F of the first underfill 35 may be in continuity with an outside of the first portion 35C. The first portion 35C of the first underfill 35 may be confined between the first semiconductor chip 21 and the lower structure 11. The first portion 35C of the first underfill 35 may be aligned to be adjacent to a center region of the first semiconductor chip 21. The second portion 35F of the first underfill 35 may be aligned to be adjacent to an edge region of the first semiconductor chip 21. The second portion 35F of the first underfill 35 may extend between the first semiconductor chip 21 and the lower structure 11. The second portion 35F of the first underfill 35 may protrude outside the first semiconductor chip 21. The second portion 35F of the first underfill 35 may extend on side surfaces of the first semiconductor chip 21. The second portion 35F of the first underfill 35 may contact the side surfaces of the first semiconductor chip 21.

The plurality of inner connection terminals 42 may contact the plurality of first pads 57 of the first semiconductor chip 21 and extend through the first underfill 35. The plurality of inner connection terminals 42 may contact the plurality of second pads 58 of the lower structure 11 and extend through the first underfill 35. The plurality of inner connection terminals 42 may include Sn, Ag, Cu, Al, AlN, Au, Be, Bi, Co, Hf, In, Mn, Mo, Ni, Pb, Pd, Pt, Rh, Re, Ru, Ta, TaN, Te, Ti, TiN, W, WN, Zn, Zr, or a combination thereof. Each of the plurality of inner connection terminals 42 may include a conductive bump, a conductive ball, a conductive pin, a conductive lead, a conductive pillar, or a combination thereof. For example, each of the plurality of inner connection terminals 42 may include a conductive bump.

The second semiconductor chip 22 and the third semiconductor chip 23 may be sequentially vertically stacked on the first semiconductor chip 21. The upper semiconductor chip 28 may be vertically stacked on the third semiconductor chip 23. One or a plurality of different semiconductor chips may be additionally stacked between the third semiconductor chip 23 and the upper semiconductor chip 28. The plurality of second underfills 39 may be between the first semiconductor chip 21, the second semiconductor chip 22, the third semiconductor chip 23 and the upper semiconductor chip 28, respectively. The plurality of inner connection terminals 42, which extends through the plurality of second underfills 39, may be between the first semiconductor chip 21, the second semiconductor chip 22, the third semiconductor chip 23 and the upper semiconductor chip 28, respectively.

Each of the second semiconductor chip 22 and the third semiconductor chip 23 may include a configuration similar to that of the first semiconductor chip 21. The upper semiconductor chip 28 may include a configuration similar to that of the first semiconductor chip 21. The plurality of first pads 57 may be on a lower surface of the upper semiconductor chip 28. The upper semiconductor chip 28 may have a thickness different from that of the first semiconductor chip 21. The upper semiconductor chip 28 may be thicker than the first semiconductor chip 21. In an embodiment, each of the first semiconductor chip 21, the second semiconductor chip 22, the third semiconductor chip 23, and the upper semiconductor chip 28 may include a volatile memory such as DRAM.

Each of the plurality of second underfills 39 may include a non-conductive film (NCF) including laser-sensitive additives or a non-conductive film (NCF) not including laser-sensitive additives. In an embodiment, each of the plurality of second underfills 39 may include the filler, the first epoxy, the second epoxy, the first polymer, the second polymer, the flux, and the laser-sensitive additives. In an embodiment, each of the plurality of second underfills 39 may include the filler, the first epoxy, the second epoxy, the first polymer, the second polymer, and the flux.

Each of the plurality of second underfills 39 may have a substantially uniform degree of cure. In each of the plurality of second underfills 39, the degree of cure of a portion thereof adjacent to a center region of a corresponding one of the second semiconductor chip 22, the third semiconductor chip 23 and the upper semiconductor chip 28 may be substantially equal to the degree of cure of a portion thereof adjacent to an edge region of the corresponding one of the second semiconductor chip 22, the third semiconductor chip 23 and the upper semiconductor chip 28. Each of the plurality of second underfills 39 may protrude outside the second semiconductor chip 22, the third semiconductor chip 23, and the upper semiconductor chip 28. The plurality of second underfills 39 may contact side surfaces of the first semiconductor chip 21, the second semiconductor chip 22, the third semiconductor chip 23, and the upper semiconductor chip 28, respectively.

The encapsulator 47, which covers the first semiconductor chip 21, the second semiconductor chip 22, the third semiconductor chip 23, the upper semiconductor chip 28, the first underfill 35 and the plurality of second underfills 39, may be on the lower structure 11. The encapsulator 47 may include an epoxy molding compound (EMC).

In accordance with example embodiments of the disclosure, the second portion 35F having a higher degree of cure than the first portion 35C may function to prevent excessive lateral extension of the first underfill 35. The sizes and shapes of the first underfill 35 and the plurality of second underfills 39 may be controlled.

FIGS. 3 to 13 are sectional views explaining semiconductor packages according to example embodiments of the disclosure.

Figure 3:
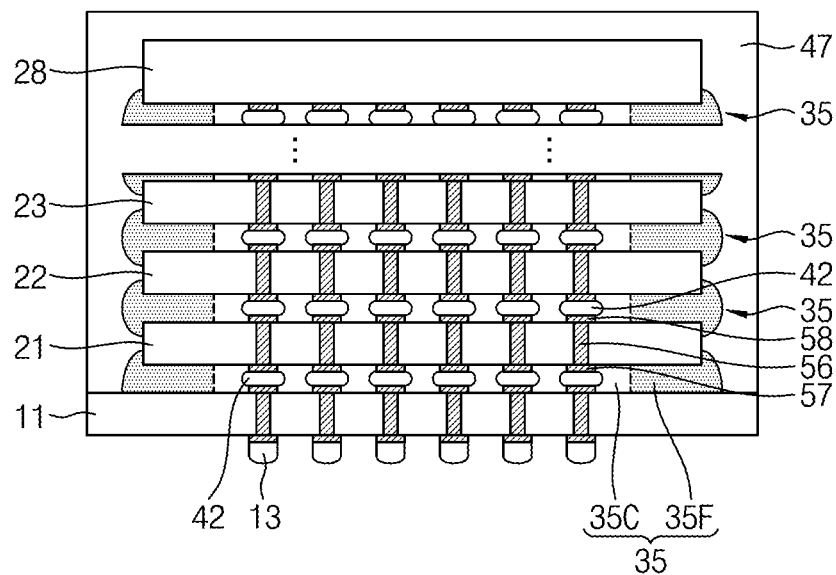
FIGS. 3 to 13 are sectional views explaining semiconductor packages according to example embodiments of the disclosure.

Referring to FIG. 3, semiconductor packages according to example embodiments of the disclosure may include a lower structure 11, a plurality of outer connection terminals 13, a first semiconductor chip 21, a second semiconductor chip 22, a third semiconductor chip 23, an upper semiconductor chip 28, a plurality of first underfills 35, a plurality of inner connection terminals 42, and an encapsulator 47.

The plurality of first underfills 35 may be between the lower structure 11, the first semiconductor chip 21, the second semiconductor chip 22, the third semiconductor chip 23, and the upper semiconductor chip 28. Each of the plurality of first underfills 35 may include a non-conductive film (NCF) including laser-sensitive additives. Each of the plurality of first underfills 35 may include a first portion 35C, and a second portion 35F in continuity with an outside of the first portion 35C. The second portion 35F may have a higher degree of cure than the first portion 35C.

Figure 4:
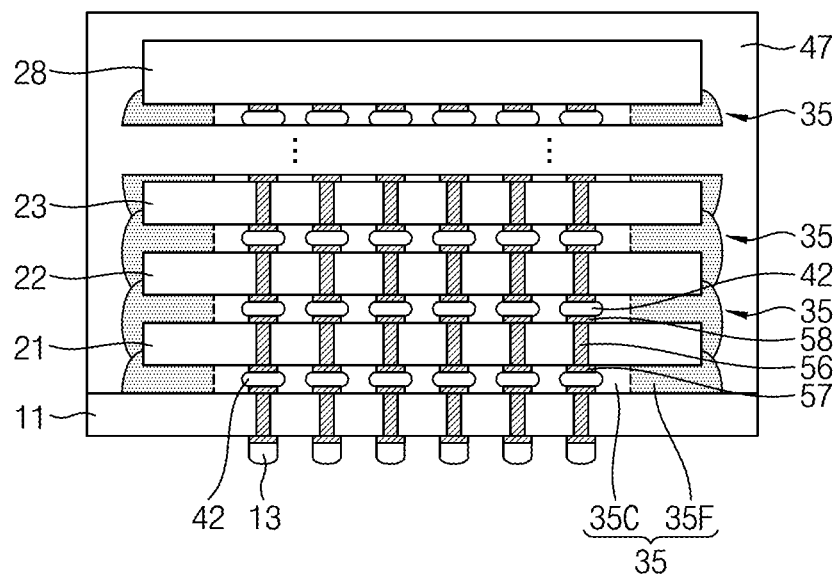

Referring to FIG. 4, a plurality of first underfills 35 may contact one another.

Figure 5:
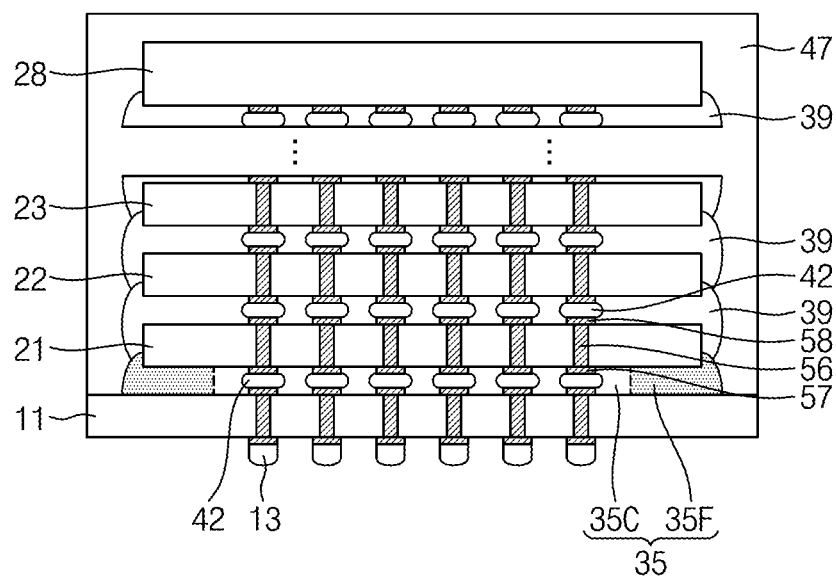

Referring to FIG. 5, a first underfill 35 and a plurality of second underfills 39 may contact one another. The first underfill 35 may contact one of the plurality of second underfills 39 adjacent thereto.

Figure 6:
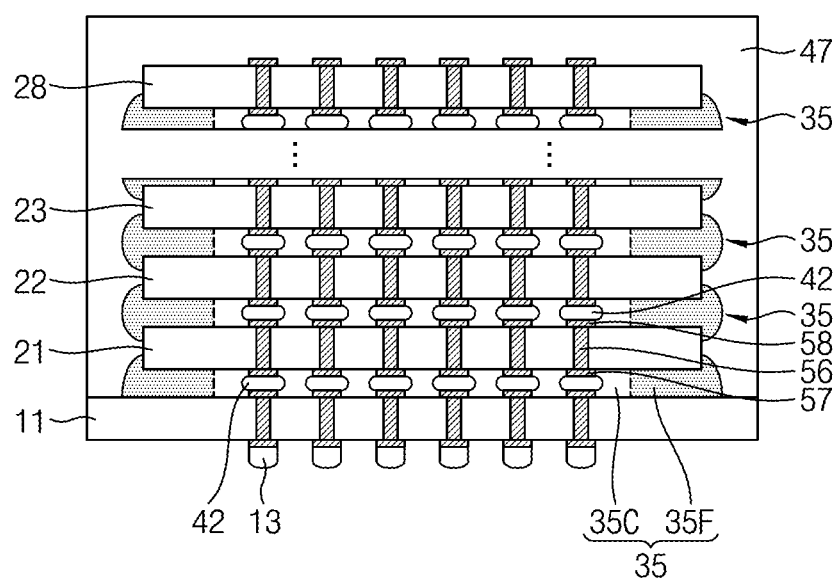

Referring to FIG. 6, an upper semiconductor chip 28 may include a configuration similar to that of a first semiconductor chip 21. For example, the upper semiconductor chip 28 may have substantially the same thickness as the first semiconductor chip 21. The upper semiconductor chip 28 may include a plurality of through-silicon vias 56, a plurality of first pads 57, and a plurality of second pads 58.

Figure 7:
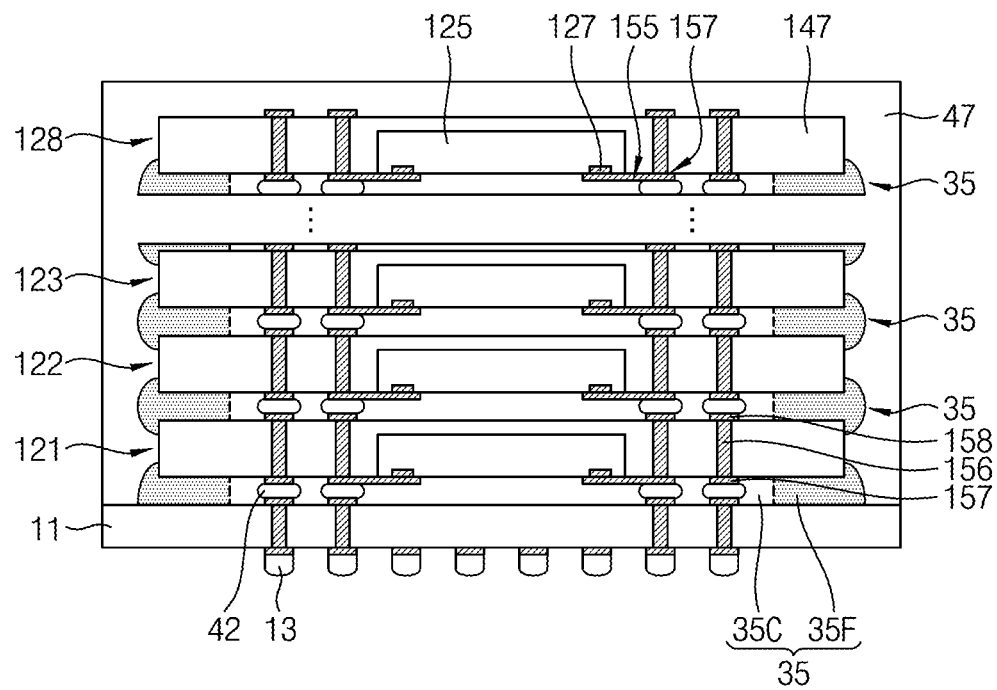

Referring to FIG. 7, semiconductor packages according to example embodiments of the disclosure may include a lower structure 11, a plurality of outer connection terminals 13, a first sub-package 121, a second sub-package 122, a third sub-package 123, an upper sub-package 128, a plurality of first underfills 35, a plurality of inner connection terminals 42, and an encapsulator 47.

The first sub-package 121, the second sub-package 122, the third sub-package 123, and the upper sub-package 128 may be sequentially vertically stacked on the lower structure 11. The plurality of first underfills 35 may be between the lower structure 11, the first sub-package 121, the second sub-package 122, the third sub-package 123, and the upper sub-package 128.

Each of the first sub-package 121, the second sub-package 122, the third sub-package 123, and the upper sub-package 128 may include a semiconductor chip 125, a plurality of chip pads 127, an inner encapsulator 147, a plurality of redistribution layers 155, a plurality of through-silicon vias 156, a plurality of first pads 157, and a plurality of second pads 158.

The semiconductor chip 125 may include a configuration similar to that of the first semiconductor chip ("21" in FIG. 1). The chip pad 127 may be adjacent to one surface of the semiconductor chip 125. For example, the plurality of chip pads 127 may be adjacent to a lower surface of the semiconductor chip 125. The inner encapsulator 147 may cover a side surface of the semiconductor chip 125. In an embodiment, the inner encapsulator 147 may cover the side surface of the semiconductor chip 125 and an upper surface of the semiconductor chip 125. The inner encapsulator 147 may include an epoxy molding compound (EMC), a printed circuit board, a ceramic substrate, a semiconductor substrate, or a combination thereof.

The plurality of through-silicon vias 156 may extend through the inner encapsulator 147. The plurality of first pads 157 may be on a lower surface of the inner encapsulator 147. The plurality of first pads 157 may contact the plurality of through-silicon vias 156. The plurality of redistribution layers 155 may contact the plurality of first pads 157 and the plurality of chip pads 127. The plurality of second pads 158 may be on an upper surface of the inner encapsulator 147. The plurality of second pads 158 may contact the plurality of through-silicon vias 156.

Each of the plurality of chip pads 127, the plurality of redistribution layers 155, the plurality of through-silicon vias 156, the plurality of first pads 157, and the plurality of second pads 158 may include Cu, Ag, Al, AlN, Au, Be, Bi, Co, Hf, In, Mn, Mo, Ni, Pb, Pd, Pt, Rh, Re, Ru, Sn, Ta, TaN, Te, Ti, TiN, W, WN, Zn, Zr, or a combination thereof.

Figure 8:
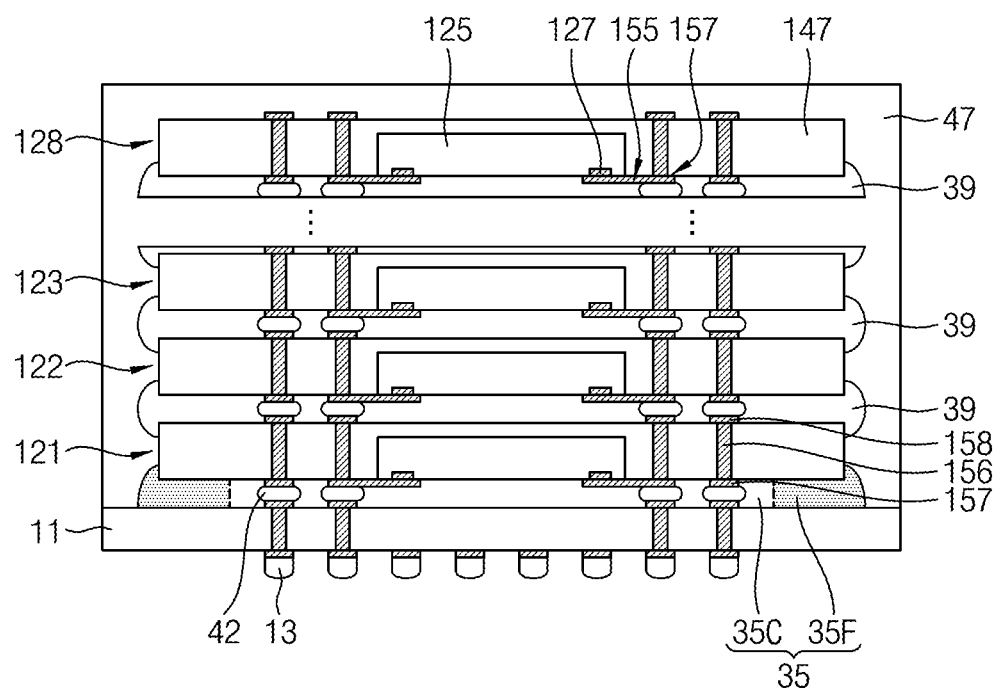

Referring to FIG. 8, semiconductor packages according to example embodiments of the disclosure may include a lower structure 11, a plurality of outer connection terminals 13, a first sub-package 121, a second sub-package 122, a third sub-package 123, an upper sub-package 128, a first underfill 35, a plurality of second underfills 39, a plurality of inner connection terminals 42, and an encapsulator 47. The first underfill 35 may be between the lower structure 11 and the first sub-package 121. The plurality of second underfills 39 may be between the first sub-package 121, the second sub-package 122, the third sub-package 123, and the upper sub-package 128.

Figure 9:
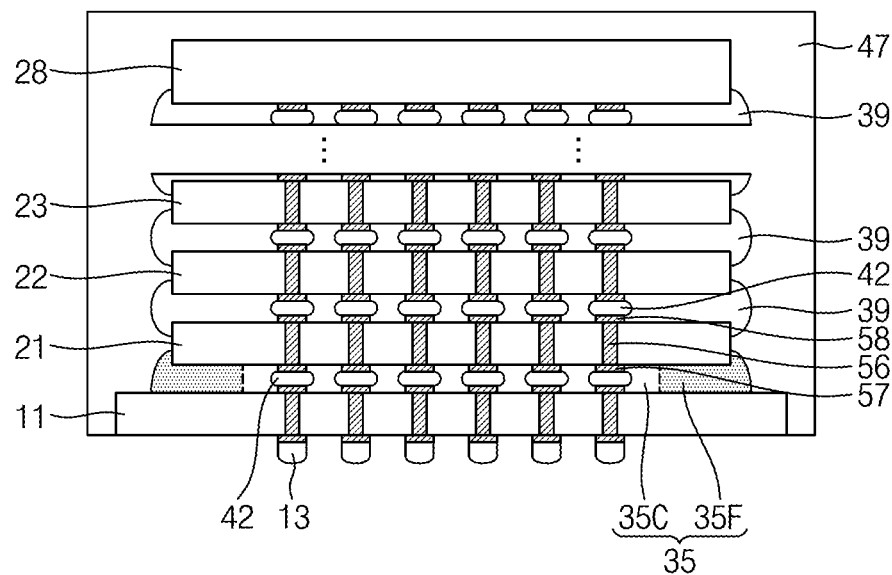

Referring to FIG. 9, semiconductor packages according to example embodiments of the disclosure may include a lower structure 11, a plurality of outer connection terminals 13, a first semiconductor chip 21, a second semiconductor chip 22, a third semiconductor chip 23, an upper semiconductor chip 28, a first underfill 35, a plurality of second underfills 39, a plurality of inner connection terminals 42, and an encapsulator 47. The encapsulator 47 may extend on side surfaces of the lower structure 11. The encapsulator 47 may cover the side surfaces of the lower structure 11.

Figure 10:
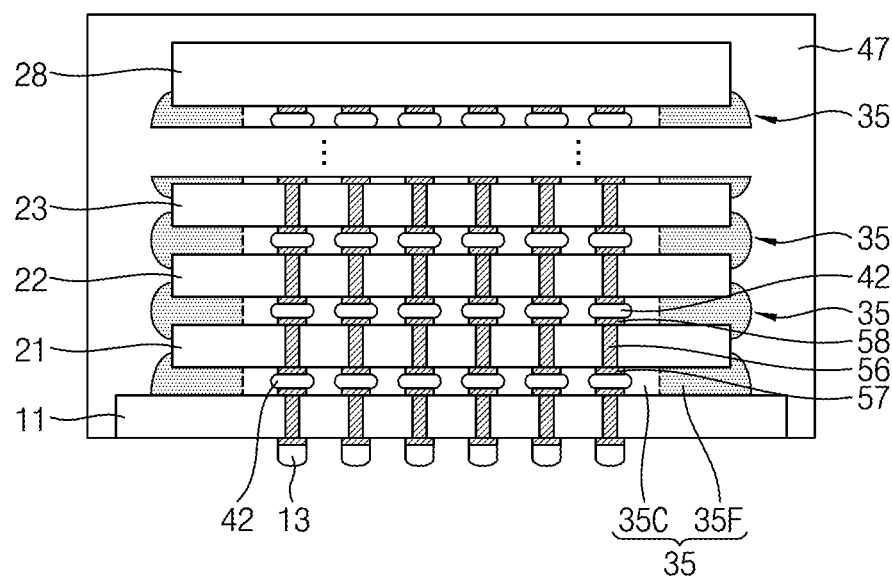

Referring to FIG. 10, semiconductor packages according to example embodiments of the disclosure may include a lower structure 11, a plurality of outer connection terminals 13, a first semiconductor chip 21, a second semiconductor chip 22, a third semiconductor chip 23, an upper semiconductor chip 28, a plurality of first underfills 35, a plurality of inner connection terminals 42, and an encapsulator 47. The encapsulator 47 may extend on side surfaces of the lower structure 11. The encapsulator 47 may cover the side surfaces of the lower structure 11.

Figure 11:
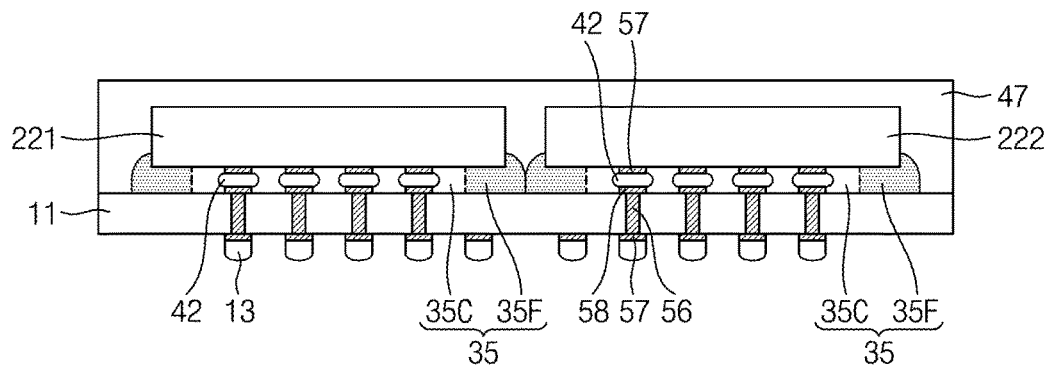

Referring to FIG. 11, semiconductor packages according to example embodiments of the disclosure may include a lower structure 11, a plurality of outer connection terminals 13, a plurality of inner connection terminals 42, an encapsulator 47, a first semiconductor chip 221, and a second semiconductor chip 222. The second semiconductor chip 222 may be adjacent to the first semiconductor chip 221. The second semiconductor chip 222 may be at substantially the same horizontal level as the first semiconductor chip 221. The plurality of first underfills 35 may be between the first semiconductor chip 221 and the lower structure 11 and between the second semiconductor chip 222 and the lower structure 11.

Each of the plurality of first underfills 35 may include a first portion 35C and a second portion 35F. The second portion 35F, which has a higher degree of cure than the first portion 35C, may function to prevent excessive lateral extension of the plurality of first underfills 35. The distance between the first semiconductor chip 221 and the second semiconductor chip 222 may be minimized.

Figure 12:
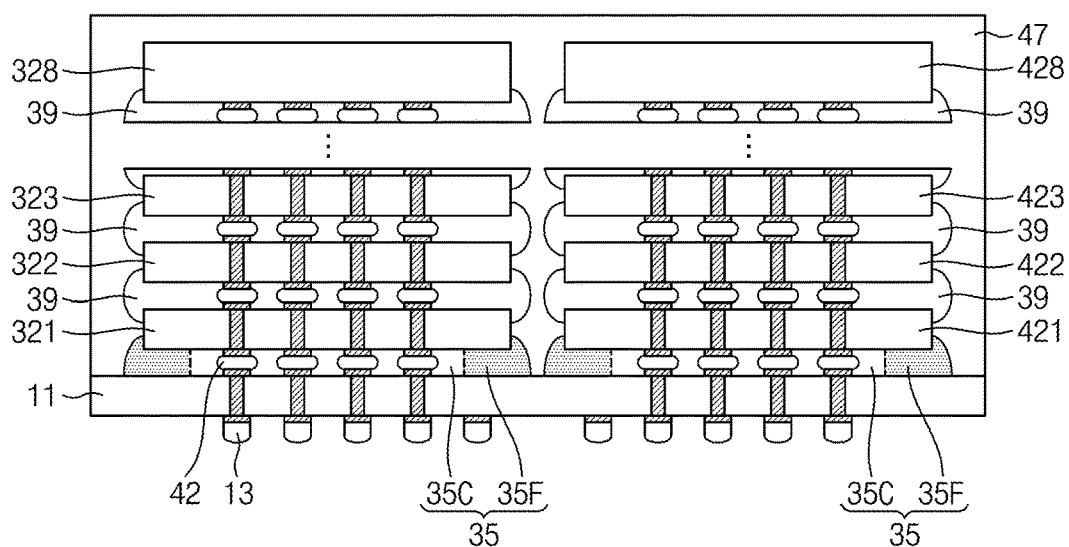

Referring to FIG. 12, semiconductor packages according to example embodiments of the disclosure may include a lower structure 11, a plurality of outer connection terminals 13, a plurality of first underfills 35, a plurality of second underfills 39, a plurality of inner connection terminals 42, an encapsulator 47, a first semiconductor chip 321, a second semiconductor chip 322, a third semiconductor chip 323, a first upper semiconductor chip 328, a fourth semiconductor chip 421, a fifth semiconductor chip 422, a sixth semiconductor chip 423, and a second upper semiconductor chip 428.

The first semiconductor chip 321, the second semiconductor chip 322, the third semiconductor chip 323, and the first upper semiconductor chip 328 may be sequentially vertically stacked on the lower structure 11. The first semiconductor chip 321, the second semiconductor chip 322, the third semiconductor chip 323, and the first upper semiconductor chip 328 may constitute a first tower. The fourth semiconductor chip 421, the fifth semiconductor chip 422, the sixth semiconductor chip 423, and the second upper semiconductor chip 428 may be sequentially vertically stacked on the lower structure 11. The fourth semiconductor chip 421, the fifth semiconductor chip 422, the sixth semiconductor chip 423, and the second upper semiconductor chip 428 may constitute a second tower. The second tower may be adjacent to the first tower.

The plurality of first underfills 35 may be between the first semiconductor chip 321 and the lower structure 11 and between the fourth semiconductor chip 421 and the lower structure 11. The plurality of second underfills 39 may be between the first semiconductor chip 321, the second semiconductor chip 322, the third semiconductor chip 323 and the first upper semiconductor chip 328 and between the fourth semiconductor chip 421, the fifth semiconductor chip 422, the sixth semiconductor chip 423 and the second upper semiconductor chip 428. Each of the plurality of first underfills 35 may include a first portion 35C and a second portion 35F. The second portion 35F, which has a higher degree of cure than the first portion 35C, may function to prevent excessive lateral extension of the plurality of first underfills 35. The distance between the first tower and the second tower may be minimized.

Figure 13:
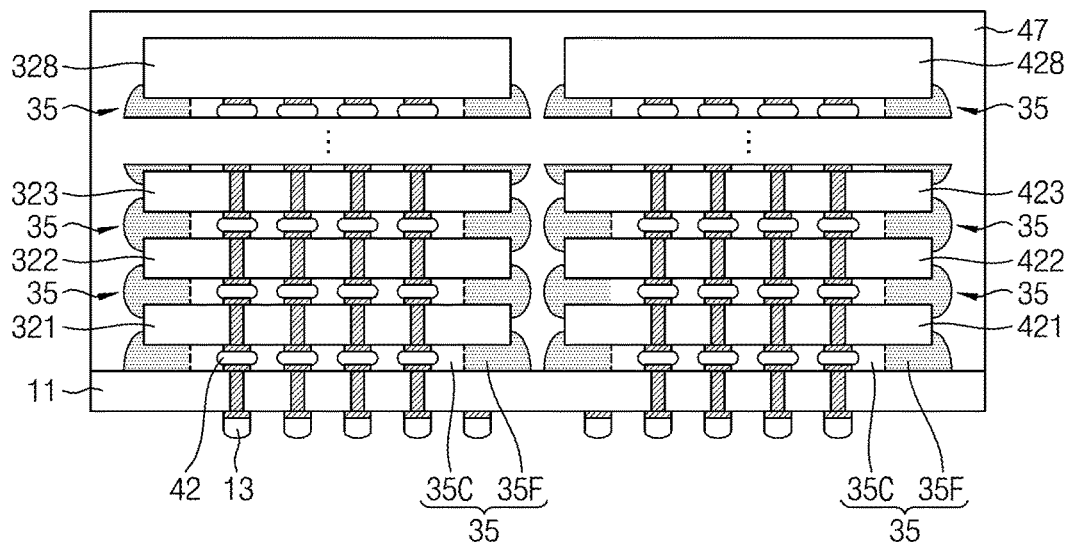

Referring to FIG. 13, semiconductor packages according to example embodiments of the disclosure may include a lower structure 11, a plurality of outer connection terminals 13, a plurality of first underfills 35, a plurality of inner connection terminals 42, an encapsulator 47, a first semiconductor chip 321, a second semiconductor chip 322, a third semiconductor chip 323, a first upper semiconductor chip 328, a fourth semiconductor chip 421, a fifth semiconductor chip 422, a sixth semiconductor chip 423, and a second upper semiconductor chip 428. The first semiconductor chip 321, the second semiconductor chip 322, the third semiconductor chip 323, and the first upper semiconductor chip 328 may constitute a first tower. The fourth semiconductor chip 421, the fifth semiconductor chip 422, the sixth semiconductor chip 423, and the second upper semiconductor chip 428 may constitute a second tower.

The plurality of first underfills 35 may be between the lower structure 11, the first semiconductor chip 321, the second semiconductor chip 322, the third semiconductor chip 323 and the first upper semiconductor chip 328 and between the lower structure 11, the fourth semiconductor chip 421, the fifth semiconductor chip 422, the sixth semiconductor chip 423 and the second upper semiconductor chip 428. Each of the plurality of first underfills 35 may include a first portion 35C and a second portion 35F. The second portion 35F, which has a higher degree of cure than the first portion 35C, may function to prevent excessive lateral extension of the plurality of first underfills 35. The distance between the first tower and the second tower may be minimized.

FIGS. 14 to 30 are sectional views and schematic views explaining semiconductor package formation methods according to example embodiments of the disclosure. FIG. 20 is a partial view showing a portion of FIG. 19.

Figure 14:
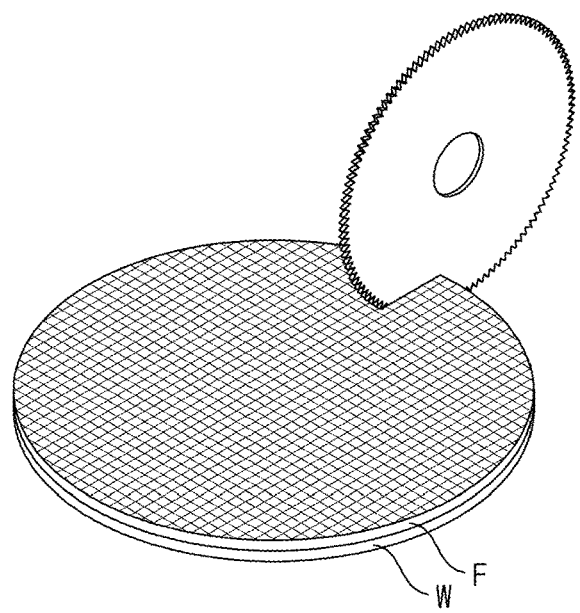
FIGS. 14 to 30 are sectional views and schematic views explaining semiconductor package formation methods according to example embodiments of the disclosure.
Figure 15:
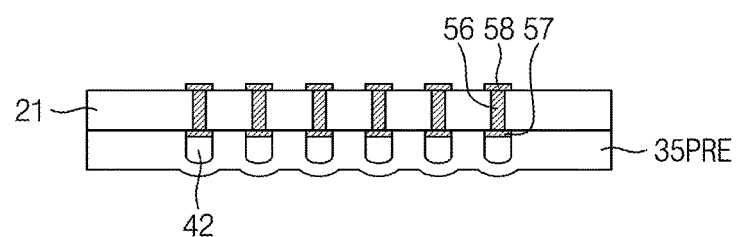

Referring to FIGS. 14 and 15, a semiconductor chip 21 may be provided. The first semiconductor chip 21 may include a plurality of through-silicon vias 56, a plurality of first pads 57, and a plurality of second pads 58. A plurality of inner connection terminals 42 may be formed on the plurality of first pads 57. A preliminary underfill 35PRE covering the plurality of inner connection terminals 42 may be formed on the first semiconductor chip 21. A surface of the preliminary underfill 35PRE may include a plurality of uneven portions. Convex surfaces of the preliminary underfill 35PRE may be aligned with the plurality of inner connection terminals 42.

In an embodiment, forming the preliminary underfill 35PRE on the first semiconductor chip 21 may include forming a film F on a wafer W, and performing separation using a sawing process, as shown in FIG. 14. The first semiconductor chip 21 may be separated from the wafer W, and the preliminary underfill 35PRE may be separated from the film F. Side surfaces of the first semiconductor chip 21 and the preliminary underfill 35PRE may be substantially coplanar.

The preliminary underfill 35PRE may include a non-conductive film (NCF) including laser-sensitive additives. In an embodiment, the content of the laser-sensitive additives in the preliminary underfill 35PRE may be 0.01 to 10 wt %.

In an embodiment, the preliminary underfill 35PRE may include a filler, a first epoxy, a second epoxy, a first polymer, a second polymer, a flux, and laser-sensitive additives.

The filler may include SiO, TiO, AlO, SiC, BN, or a combination thereof. For example, the filler may include $SiO_2$. The first epoxy may include a liquid type material to adjust bonding characteristics. The first epoxy may include bisphenol A, phenol novolac, bisphenol F, or a combination thereof. The second epoxy may include a solid type material to adjust bonding characteristics. The second epoxy may include naphthalene-group epoxy, cresol novolac epoxy, bisphenol A, or a combination thereof. The first polymer may include a hardener. The first polymer may include a novolac phenol resin, polyamine, polyamide, or a combination thereof. The second polymer may include a thermoplastic resin for film formation. The second polymer may include a phenoxy resin, a polyvinyl butyral (PVB) resin, or a combination thereof.

The laser-sensitive additives may include polybenzoxazole (PBO), polyimide (PI) such as photo-sensitive polyimide (PSPI), benzocyclobutene (BCB), or a combination thereof. For example, the laser-sensitive additives may include polybenzoxazole (PBO).

In an embodiment, the preliminary underfill 35PRE may include a non-conductive film (NCF) not including laser-sensitive additives. The preliminary underfill 35PRE may include the filler, the first epoxy, the second epoxy, the first polymer, the second polymer, and the flux.

Figure 16:
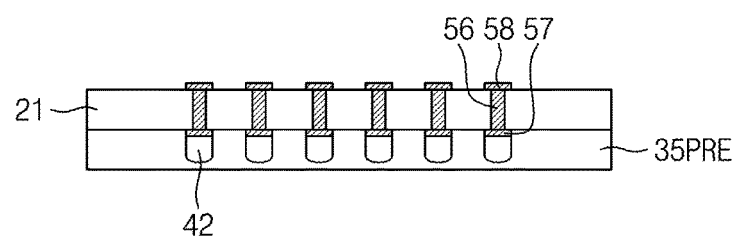

Referring to FIG. 16, in an embodiment, the surface of the preliminary underfill 35PRE may be flat.

Figure 17:
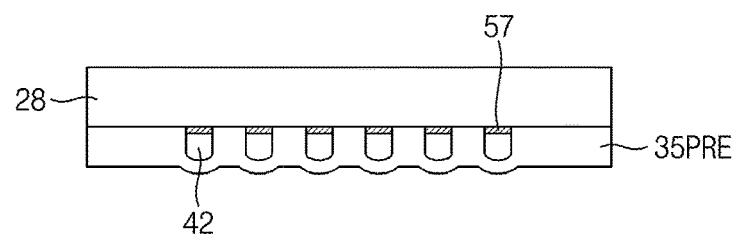

Referring to FIG. 17, an upper semiconductor chip 28 may be provided. Providing the upper semiconductor chip 28 may include a process similar to a process of providing the first semiconductor chip 21. The upper semiconductor chip 28 may include a plurality of first pads 57. The plurality of inner connection terminals 42 may be formed on the plurality of first pads 57. The preliminary underfill 35PRE, which covers the plurality of inner connection terminals 42, may be formed on the upper semiconductor chip 28.

Figure 18:
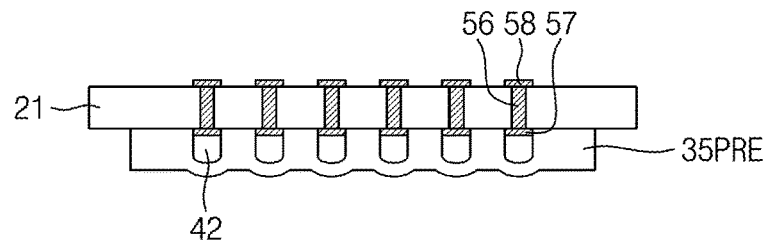

Referring to FIG. 18, in an embodiment, the preliminary underfill 35PRE may have a smaller horizontal width than the first semiconductor chip 21. The side surface of the preliminary underfill 35PRE may be misaligned from the side surface of the first semiconductor chip 21.

Figure 19:
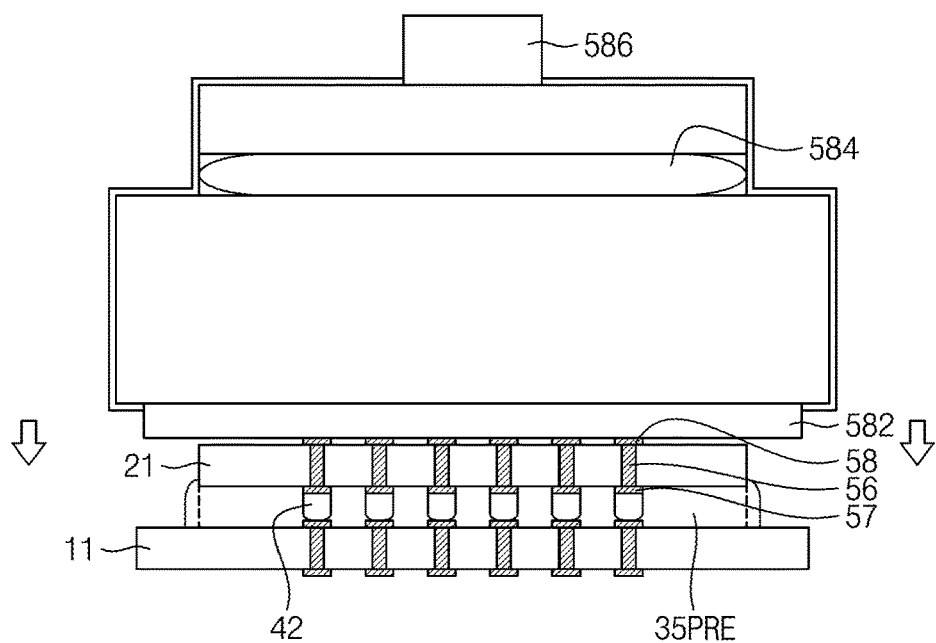
Figure 20:
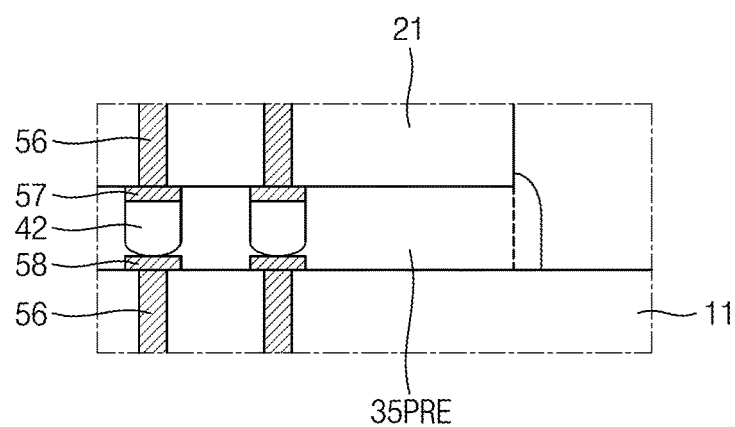

Referring to FIG. 19, a lower structure 11 may be provided. The first semiconductor chip 21 may be attached to the lower structure 11 in plan view. The preliminary underfill 35PRE may be bonded between the lower structure 11 and the first semiconductor chip 21.

In an embodiment, attaching the first semiconductor chip 21 to the lower structure 11 may include applying pressure to the first semiconductor chip 21 toward the lower structure 11 using a handling device 582. During application of pressure to the first semiconductor chip 21 toward the lower structure 11 using the handling device 582, the preliminary underfill 35PRE may be heated to a first temperature. The first temperature may be 70 to 150° C. For heating of the preliminary underfill 35PRE to the first temperature, a contact type heater, a non-contact type heater, or a combination thereof may be used. For example, the contact type heater may include a heater block. The non-contact type heater may include IR reflow, hot air reflow, or laser reflow.

Referring to FIG. 20, the plurality of inner connection terminals 42 may contact the plurality of second pads 58 of the lower structure 11 and extend through the preliminary underfill 35PRE.

Figure 21:
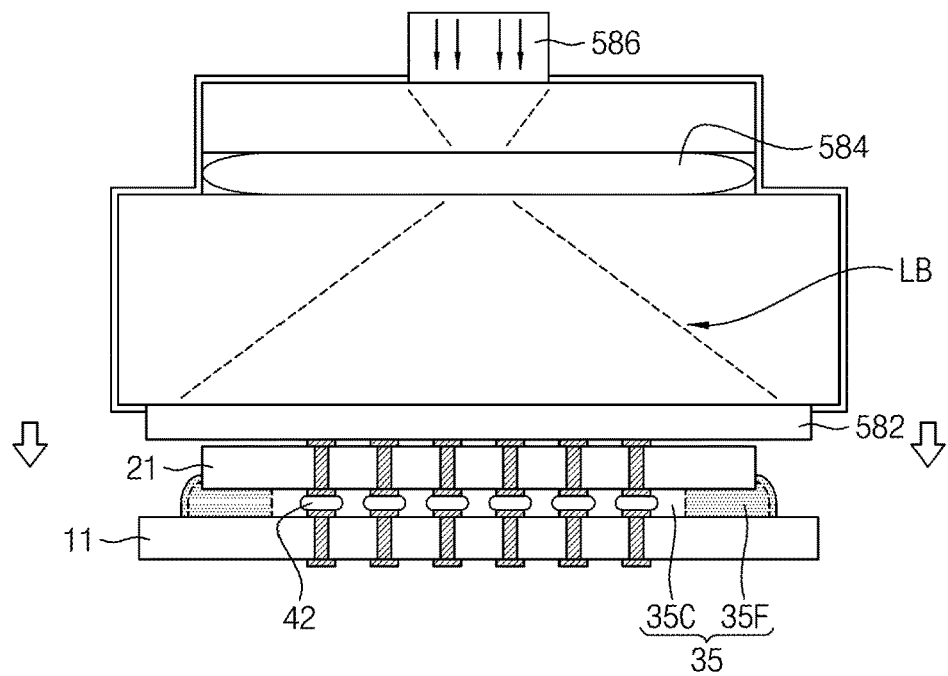
Figure 22:
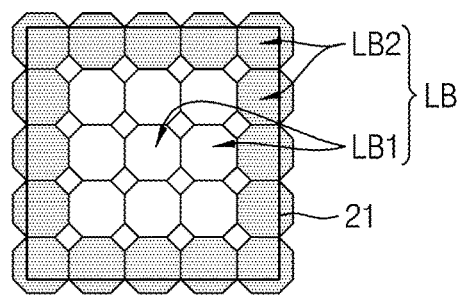

Referring to FIGS. 21 and 22, the preliminary underfill 35PRE may be cured using a laser bonding process, thereby forming a first underfill 35.

Forming the first underfill 35 using the laser bonding process may include radiating a laser beam LB toward the first semiconductor chip 21 and the preliminary underfill 35PRE using a laser generator 586 and a beam splitter 584. In an embodiment, radiating the laser beam LB toward the first semiconductor chip 21 and the preliminary underfill 35PRE may be performed for 0.1 to 5 seconds. During radiation of the laser beam LB, a pressure may be applied to the first semiconductor chip 21 toward the lower structure 11 using the handling device 582. The handling device 582 may include a material allowing the laser beam LB to pass therethrough, such as quartz or tempered glass. The beam splitter 584 may be between the laser generator 586 and the handling device 582. The laser beam LB generated using the laser generator 586 and the beam splitter 584 may be irradiated toward the first semiconductor chip 21 and the preliminary underfill 35PRE after transmission through the handling device 582.

The laser beam LB may include a plurality of first laser beams LB1 and a plurality of second laser beams LB2. Each of the plurality of second laser beams LB2 may have a higher intensity than each of the plurality of first laser beams LB1. In an embodiment, the laser beam LB may include an excimer laser or a UV laser having a wavelength of 193 to 343 nm. Each of the plurality of first laser beams LB1 may have an intensity of 40 to 80 $mJ/cm^2$. Each of the plurality of second laser beams LB2 may have an intensity of 90 to 120 $mJ/cm^2$.

The plurality of first laser beams LB1 may be aligned to irradiate a region adjacent to a center region of the first semiconductor chip 21 when viewed in a plan view. The plurality of second laser beams LB2 may be aligned to irradiate a region adjacent to an edge region of the first semiconductor chip 21 when viewed in a plan view. The irradiation range of the plurality of second laser beams LB2 may extend to an outside of the first semiconductor chip 21. In an embodiment, the plurality of first laser beams LB1 and the plurality of second laser beams LB2 may be simultaneously radiated. In an embodiment, each of the plurality of first laser beams LB1 and each of the plurality of second laser beams LB2 may be sequentially radiated at intervals of a predetermined time. The plurality of first laser beams LB1 and the plurality of second laser beams LB2 may be repeatedly radiated several times.

A region of the preliminary underfill 35PRE irradiated with the plurality of first laser beams LB1 may become a first portion 35C of the first underfill 35, and a region of the preliminary underfill 35PRE irradiated with the plurality of second laser beams LB2 may become a second portion 35F of the first underfill 35. The second portion 35F may be in continuity with an outside of the first portion 35C.

The second portion 35F may have a higher degree of cure than the first portion 35C. In an embodiment, the first portion 35C of the first underfill 35 may have a degree of cure of 10 to 35%. The second portion 35F of the first underfill 35 may have a degree of cure of 50 to 80%. The degree of cure of the first underfill 35 may be checked using a measurement device such as a Fourier-transform infrared spectroscope (FT-IR). The second portion 35F of the first underfill 35 may have a lower flowability than the first portion 35C.

The first portion 35C of the first underfill 35 may be confined between the first semiconductor chip 21 and the lower structure 11. The first portion 35C of the first underfill 35 may be aligned to be adjacent to the center region of the first semiconductor chip 21. The second portion 35F of the first underfill 35 may be aligned to be adjacent to the edge region of the first semiconductor chip 21. The second portion 35F of the first underfill 35 may extend between the first semiconductor chip 21 and the lower structure 11. The second portion 35F of the first underfill 35 may protrude outside the first semiconductor chip 21. The second portion 35F may function to prevent excessive lateral extension of the first underfill 35.

During formation of the first underfill 35 using the laser bonding process, the plurality of inner connection terminals 42 may be heated to a second temperature higher than the first temperature and, as such, may reflow. The second temperature may be 200 to 280° C. In an embodiment, heating the plurality of inner connection terminals 42 to the second temperature may be performed by the laser beam LB.

In an embodiment, for heating of the plurality of inner connection terminals 42 to the second temperature, a combination of the laser beam LB and a contact type heater may be used. For example, the contact type heater may include a heater block. In an embodiment, for heating of the plurality of inner connection terminals 42 to the second temperature, a combination of the laser beam LB and a non-contact type heater may be used. For example, the non-contact type heater may include IR reflow or hot air reflow. In an embodiment, for heating of the plurality of inner connection terminals 42 to the second temperature, a combination of the laser beam LB, a contact type heater, and a non-contact type heater may be used.

Figure 23:
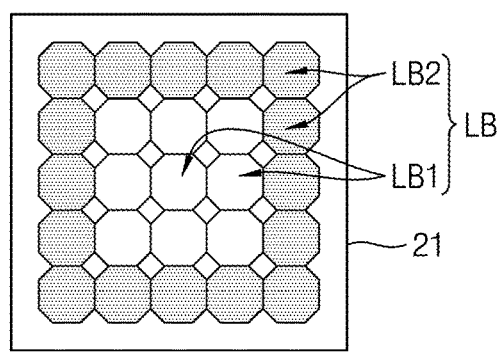

Referring to FIG. 23, a plurality of first laser beams LB1 may be aligned to irradiate a region adjacent to the center region of the first semiconductor chip 21 when viewed in a plan view. A plurality of second laser beams LB2 may be aligned to irradiate a region adjacent to the edge region of the first semiconductor chip 21 when viewed in a plan view. The irradiation range of the plurality of second laser beams LB2 may be limited within the first semiconductor chip 21 when viewed in a plan view.

Figure 24:
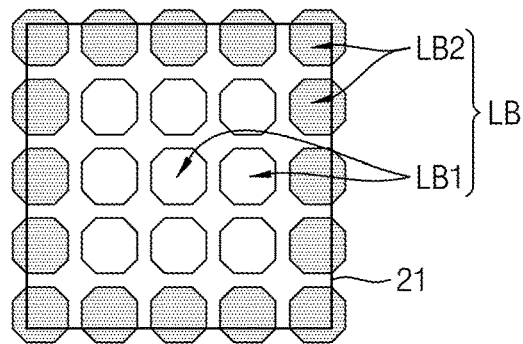

Referring to FIG. 24, each of a plurality of first laser beams LB1 and each of a plurality of second laser beams LB2 may be spaced apart from each other.

Figure 25:
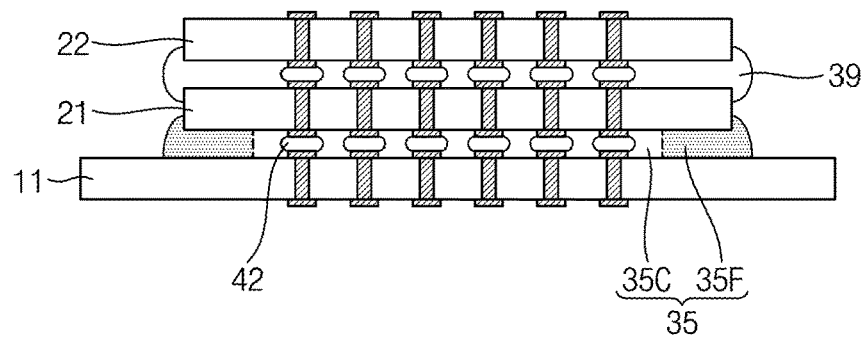

Referring to FIG. 25, a second semiconductor chip 22 may be attached to the first semiconductor chip 21 and is shown in plan view. A second underfill 39 may be formed between the first semiconductor chip 21 and the second semiconductor chip 22. The plurality of inner connection terminals 42, which is connected to the first semiconductor chip 21 and the second semiconductor chip 22 and extend through the second underfill 39, may be formed.

In an embodiment, formation of the second semiconductor chip 22, the plurality of inner connection terminals 42 and the second underfill 39 on the first semiconductor chip 21 may include a thermocompression bonding (TC bonding) process. The TC bonding process may include applying pressure to the second semiconductor chip 22 toward the first semiconductor chip 21, and heating the plurality of inner connection terminals 42 to the second temperature. The second underfill 39 may include a configuration similar to that of the preliminary underfill 35PRE. In an embodiment, for heating of the plurality of inner connection termi-nals 42 to the second temperature during execution of the TC bonding process, a contact type heater, a non-contact type heater, or a combination thereof may be used.

In an embodiment, the second underfill 39 may include a non-conductive film (NCF) including laser-sensitive additives or a non-conductive film (NCF) not including laser-sensitive additives. In an embodiment, the second underfill 39 may include the filler, the first epoxy, the second epoxy, the first polymer, the second polymer, the flux, and the laser-sensitive additives. In an embodiment, the second underfill 39 may include the filler, the first epoxy, the second epoxy, the first polymer, the second polymer, and the flux.

During execution of the TC bonding process, the second underfill 39 may be cured at the second temperature. The second underfill 39 may have a substantially uniform degree of cure. In the second underfill 39, the degree of cure of a portion thereof adjacent to a center region of the second semiconductor chip 22 may be substantially equal to the degree of cure of a portion thereof adjacent to an edge region of the second semiconductor chip 22.

Figure 26:
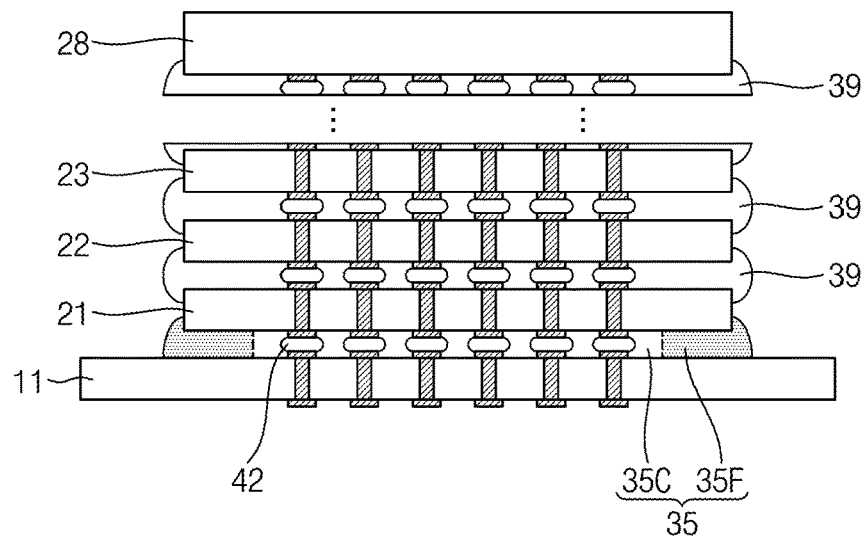

Referring to FIG. 26, a third semiconductor chip 23 and an upper semiconductor chip 28 may be sequentially stacked on the second semiconductor chip 22. A plurality of second underfills 39 may be formed between the second semiconductor chip 22, the third semiconductor chip 23 and the upper semiconductor chip 28. The plurality of inner connection terminals 42, which extends through the plurality of second underfills 39, may be formed. Formation of the third semiconductor chip 23, the upper semiconductor chip 28, the plurality of second underfills 39 and the plurality of inner connection terminals 42 on the second semiconductor chip 22 may include a TC bonding process similar to the TC bonding process described with reference to FIG. 25.

Figure 27:
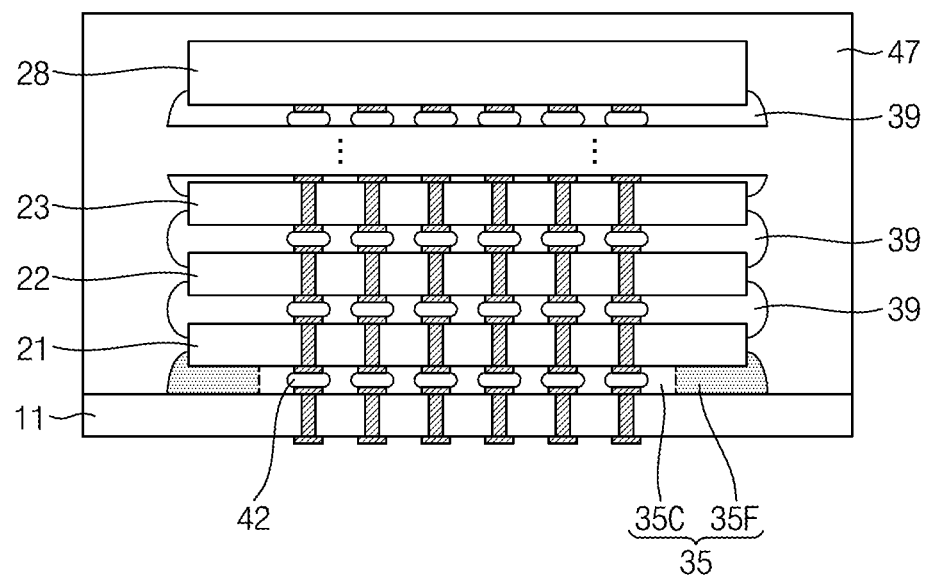

Referring to FIG. 27, an encapsulator 47, which covers the first semiconductor chip 21, the second semiconductor chip 22, the third semiconductor chip 23, the upper semiconductor chip 28, the first underfill 35, and the plurality of second underfills 39, may be formed on the lower structure 11. In an embodiment, for formation of the encapsulator 47, an injection molding method may be used. The encapsulator 47 may include an epoxy molding compound (EMC).

Figure 28:
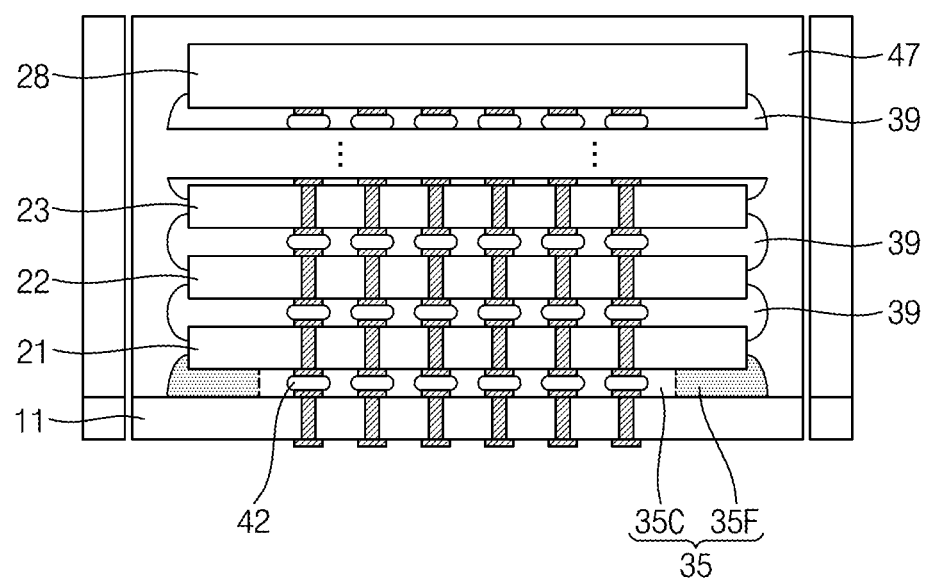

Referring to FIG. 28, separation of a semiconductor package may be performed using a cutting process.

Again referring to FIG. 1, a plurality of outer connection terminals 13 may be formed on a lower surface of the lower structure 11. In an embodiment, the plurality of outer connection terminals 13 may be omitted.

Figure 29:
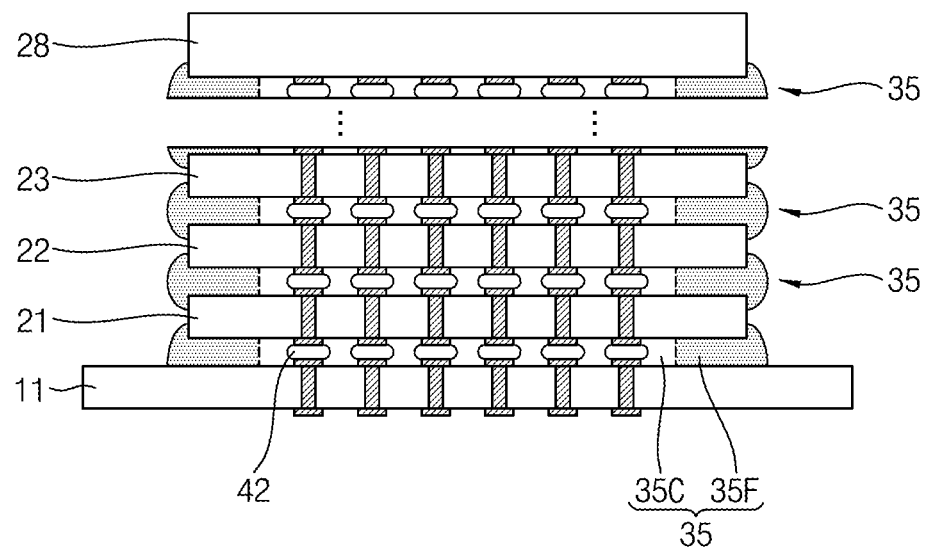

Referring to FIG. 29, a first semiconductor chip 21, a second semiconductor chip 22, a third semiconductor chip 23, and an upper semiconductor chip 28 may be sequentially stacked on a lower structure 11. A plurality of first underfills 35 may be formed between the lower structure 11, the first semiconductor chip 21, the second semiconductor chip 22, the third semiconductor chip 23 and the upper semiconductor chip 28. A plurality of inner connection terminals 42, which is connected to the lower structure 11, the first semiconductor chip 21, the second semiconductor chip 22, the third semiconductor chip 23 and the upper semiconductor chip 28 extend through the plurality of first underfills 35, may be formed.

Formation of the first semiconductor chip 21, the second semiconductor chip 22, the third semiconductor chip 23, the upper semiconductor chip 28, the plurality of first underfills 35 and the plurality of inner connection terminals 42 on the lower structure 11 may include a laser bonding process similar to the laser bonding process described with reference to FIGS. 19 to 24. Each of the plurality of first underfills 35 may include a non-conductive film (NCF) including laser-sensitive additives. Each of the plurality of first underfills 35 may include a first portion 35C, and a second portion 35F in continuity with an outside of the first portion 35C. The second portion 35F may have a higher degree of cure than the first portion 35C.

Figure 30:
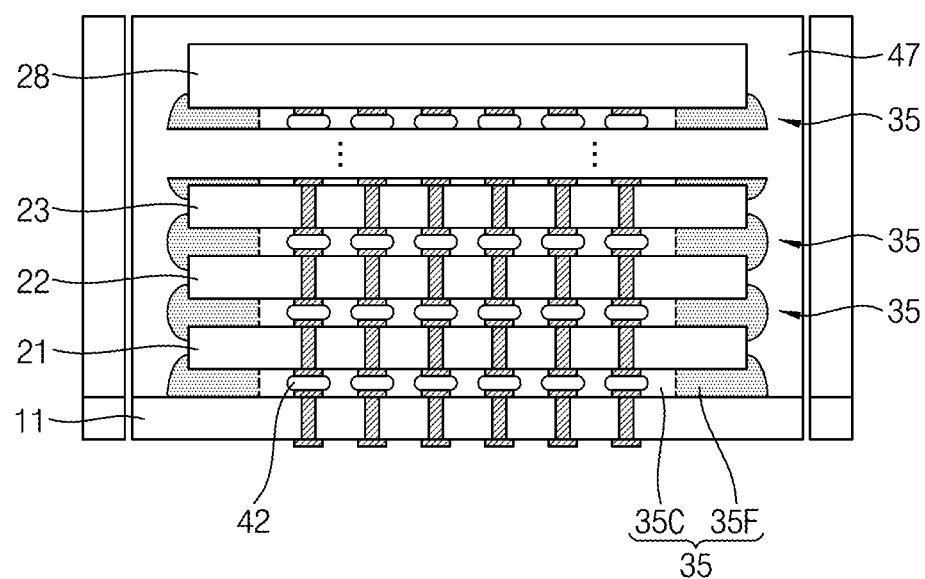

Referring to FIG. 30, an encapsulator 47, which covers the first semiconductor chip 21, the second semiconductor chip 22, the third semiconductor chip 23, the upper semiconductor chip 28 and the plurality of first underfills 35, may be formed on the lower structure 11. Separation of a semiconductor package may be performed using a cutting process.

In accordance with example embodiments of the disclosure, a plurality of semiconductor chips is stacked on a lower structure. A plurality of underfills is between the lower structure and the plurality of semiconductor chips. A first underfill between the lower structure and a first semiconductor chip includes a first portion adjacent to a center region of the first semiconductor chip, and a second portion adjacent to an edge region of the first semiconductor chip. The second portion has a higher degree of cure than the first portion. The second portion may function to prevent excessive lateral extension of the first underfill. A semiconductor package capable of controlling lateral extension of an underfill and a formation method thereof may be provided.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor package comprising:
   a lower structure;
   a first semiconductor chip on the lower structure;
   a first underfill between the first semiconductor chip and the lower structure, the first underfill comprising a first portion adjacent to a center region of the first semiconductor chip, and a second portion adjacent to an edge region of the first semiconductor chip, the second portion having a higher degree of cure than the first portion; and
   a plurality of inner connection terminals between the first semiconductor chip and the lower structure and extending into the first underfill, wherein the first underfill comprises a non-conductive film (NCF) comprising laser-sensitive additives.

2. The semiconductor package according to claim 1, wherein the second portion extends between the first semiconductor chip and the lower structure, protrudes outside the first semiconductor chip, and contacts a side surface of the first semiconductor chip.

3. The semiconductor package according to claim 1, wherein:
   the first portion has a degree of cure of 10 to 35%; and
   the second portion has a degree of cure of 50 to 80%.

4. The semiconductor package according to claim 1, wherein the laser-sensitive additives comprise polybenzoxazole (PBO), polyimide (PI), benzocyclobutene (BCB), or a combination thereof.

5. The semiconductor package according to claim 1, wherein a content of the laser-sensitive additives in the first underfill is 0.01 to 10 wt %.

6. The semiconductor package according to claim 1, wherein:
   the first underfill comprises a filler, a first epoxy, a second epoxy, a first polymer, a second polymer, a flux, and the laser-sensitive additives;
   the filler comprises SiO, TiO, AlO, SiC, BN, or a combination thereof;
   the first epoxy comprises a liquid type material to adjust bonding characteristics;
   the second epoxy comprises a solid type material to adjust bonding characteristics;
   the first polymer comprises a hardener; and
   the second polymer comprises a thermoplastic resin for film formation.

7. The semiconductor package according to claim 1, further comprising:
   a second semiconductor chip on the first semiconductor chip; and
   a second underfill between the first semiconductor chip and the second semiconductor chip.

8. The semiconductor package according to claim 7, wherein, in the second underfill, a degree of cure of a portion thereof adjacent to a center region of the second semiconductor chip and a degree of cure of a portion thereof adjacent to an edge region of the second semiconductor chip are substantially equal.

9. The semiconductor package according to claim 7, wherein the second underfill comprises a non-conductive film (NCF) comprising laser-sensitive additives or a non-conductive film (NCF) not comprising laser-sensitive additives.

10. A method for forming a semiconductor package, the semiconductor package comprising: a lower structure; a first semiconductor chip on the lower structure; a first underfill between the first semiconductor chip and the lower structure, the first underfill comprising a first portion adjacent to a center region of the first semiconductor chip, and a second portion adjacent to an edge region of the first semiconductor chip, the second portion having a higher degree of cure than the first portion; and a plurality of inner connection terminals between the first semiconductor chip and the lower structure and extending into the first underfill, the method comprising:
   forming, on the first semiconductor chip, the plurality of inner connection terminals and a preliminary underfill covering the plurality of inner connection terminals;
   stacking the first semiconductor chip on the lower structure such that the preliminary underfill is bonded between the first semiconductor chip and the lower structure;
   curing the preliminary underfill using a laser bonding process, thereby forming the first underfill, and reflowing the plurality of inner connection terminals during a formation of the first underfill through the curing of the preliminary underfill, wherein the first underfill comprises a non-conductive film (NCF) comprising laser-sensitive additives.

11. The method according to claim 10, wherein:
   the laser bonding process comprises
   applying a pressure to the first semiconductor chip toward the lower structure, and
   radiating a laser beam toward the first semiconductor chip and the preliminary underfill;
   the laser beam comprises a plurality of first laser beams aligned to irradiate a region adjacent to a center region of the first semiconductor chip, and a plurality of second laser beams aligned to irradiate a region adjacent to an edge region of the first semiconductor chip; and each of the plurality of second laser beams has a higher intensity than each of the plurality of first laser beams.

12. The method according to claim 11, wherein:

each of the plurality of first laser beams has an intensity of 40 to 80 mJ/cm$^2$; and each of the plurality of second laser beams has an intensity of 90 to 120 mJ/cm$^2$.

13. The method according to claim 10, wherein the preliminary underfill comprises a non-conductive film (NCF) comprising laser-sensitive additives.

14. The method according to claim 10, further comprising:

stacking a second underfill and a second semiconductor chip on the first semiconductor chip using a thermo-compression bonding process, wherein the second underfill is bonded between the first semiconductor chip and the second semiconductor chip.

15. The method according to claim 14, wherein, in the second underfill, a degree of cure of a portion thereof adjacent to a center region of the second semiconductor chip and a degree of cure of a portion thereof adjacent to an edge region of the second semiconductor chip are substantially equal.

16. The method according to claim 10, further comprising:

stacking a second semiconductor chip and the first underfill on the first semiconductor chip using the laser bonding process, wherein the first underfill is bonded between the first semiconductor chip and the second semiconductor chip.

17. A semiconductor package comprising:

a lower structure;

a plurality of semiconductor chips sequentially stacked on the lower structure;

a plurality of underfills between the plurality of semiconductor chips and the lower structure, each of the plurality of underfills comprising a first portion adjacent to a center region of a semiconductor chip of the plurality of semiconductor chips, and a second portion adjacent to an edge region of the semiconductor chip, the second portion having a higher degree of cure than the first portion; and a plurality of inner connection terminals between the plurality of semiconductor chips and the lower structure and extending into the plurality of underfills, wherein the plurality of underfills comprises a non-conductive film (NCF) comprising laser-sensitive additives and the plurality of underfills contact each other.

18. The semiconductor package according to claim 17, wherein the second portion protrudes outside the plurality of semiconductor chips and contacts side surfaces of the plurality of semiconductor chips.

* * * * *